(12) United States Patent
Nishikawa et al.

(10) Patent No.: US 7,378,647 B2
(45) Date of Patent: May 27, 2008

(54) LENS-EQUIPPED LIGHT-EMITTING DIODE DEVICE HAVING AN INTEGRALLY MOLDED LENS UNIT BEING LAMINATED ON A SEALING PORTION

(75) Inventors: Shouichi Nishikawa, Yokohama (JP); Tetsuro Komatsu, Yokohama (JP); Hatsuo Takezawa, Yokohama (JP); Yukinori Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/613,503

(22) Filed: Dec. 20, 2006

(65) Prior Publication Data
US 2007/0145255 A1    Jun. 28, 2007

(30) Foreign Application Priority Data
Dec. 26, 2005  (JP)  ............................. 2005-373498

(51) Int. Cl.
*H01J 5/02* (2006.01)
(52) U.S. Cl. .................................. 250/239; 250/216
(58) Field of Classification Search .............. 250/239, 250/216, 221, 208.1, 214.1, 214 R; 257/80–85, 257/432–436; 385/8, 9, 901
See application file for complete search history.

(56) References Cited
U.S. PATENT DOCUMENTS
5,485,317 A * 1/1996 Perissinotto et al. ........ 359/712

FOREIGN PATENT DOCUMENTS
JP    2004-343059    12/2004

* cited by examiner

*Primary Examiner*—Que T Le
(74) *Attorney, Agent, or Firm*—Oblon, Spivak, McClelland, Maier & Neustadt, P.C.

(57) ABSTRACT

A lens-equipped light-emitting diode device of the present invention includes a lead frame in which an electrode is formed, a light-emitting diode which is mounted on the electrode of the lead frame, an outer peripheral unit which is made of a first resin, which is provided on the lead frame, and in which a hollow portion is formed while an area including at least the light-emitting diode is exposed in the outer peripheral unit, a sealing portion which is made of a second resin filled in the lead frame of the hollow portion of the outer peripheral unit, and which seals the light-emitting diode, and a lens unit made of a third resin laminated and filled in the sealing portion.

18 Claims, 3 Drawing Sheets

LENS-EQUIPPED LIGHT-EMITTING DIODE DEVICE HAVING AN INTEGRALLY MOLDED LENS UNIT BEING LAMINATED ON A SEALING PORTION

CROSS-REFERENCE TO RELATED APPLICATIONS

This application is based upon and claims the benefit of priority from prior Japanese Patent Application No. 2005-373498, filed Dec. 26, 2005, the entire contents of which are incorporated herein by reference.

BACKGROUND OF THE INVENTION

1. Field of the Invention

The present invention relates to a lens-equipped light-emitting diode device which extracts light from a light-emitting diode through a lens and a method of manufacturing the same, and particularly to a lens-equipped light-emitting diode device which is excellent for light extraction efficiency and reliability and whose production cost can be reduced.

2. Description of the Related Art

FIG. 13 is a longitudinal sectional view showing a conventional lens-equipped light-emitting diode device 100. In the lens-equipped light-emitting diode device 100, a light-emitting diode element 102 is mounted through a die mounting material (not shown) on a lead frame 101 in which an electrode is formed, and an electrode of the light-emitting diode element 102 and an electrode exposed outside the lead frame are connected by a bonding wire 103.

A sealing portion 104 made of resin is formed around the light-emitting diode element 102, and an outer peripheral unit 105 is formed outside the lead frame 101 and light-emitting diode element 102 using a white thermoplastic resin. A lens 106 is attached to upwardly collect light emitted from the light-emitting diode element, and the lens 106 is made of a transparent resin produced in a different process. In FIG. 13, the number 107 designates a bonding agent.

Generally a transparent resin is used as the sealing portion 104. Recently, a white light-emitting diode device is proceeding toward the practical use in illumination. In this case, frequently a fluorescent material for converting blue or UV light emitted from the light-emitting diode element is mixed into the transparent resin.

In the conventional lens-equipped light-emitting diode device, the lens 106 produced in the different process is attached to the outer peripheral unit 105 by bonding or fitting. A method of casting a thermosetting resin into the outer peripheral unit 105 is also adopted (for example, see Jpn. Pat. Appln. KOKAI Publication No. 2004-343059).

In the conventional lens-equipped light-emitting diode device, there are the following problems. In the case where the lens 106 is attached to the outer peripheral unit 105 by bonding or fitting, sometimes a micro-gap is generated between the sealing portion 104 and lens 106, which decreases light extraction efficiency. There is also generated the problem that mechanical strength or a heat-resistant property is degraded due to poor adhesion between the lens 106 and the outer peripheral unit 105.

On the other hand, in a production process, the following factors become an obstacle for reducing assembly cost. That is, an assembly process of attaching the lens 106 to the outer peripheral unit 105 is required, and an optical axis adjustment process is required to accurately attaching the lens 106 to the outer peripheral unit 105. In the case where the lens 106 is formed by casting, only the thermosetting resin is used. However, generally a long-time curing process is required for the casting, so that the cost reduction also becomes the problem in the casting.

BRIEF SUMMARY OF THE INVENTION

In view of the foregoing, an object of the invention is to provide a lens-equipped light-emitting diode which is excellent in light extraction efficiency and reliability while production cost can be reduced, and a production method thereof.

In order to achieve the object, the lens-equipped light-emitting diode device according to the invention and the production method thereof have the following configurations.

A lens-equipped light-emitting diode device comprises: a support member in which an electrode is formed; a light-emitting diode which is mounted on the electrode of the support member; an outer peripheral unit which is provided on the support member, a hollow portion being formed while an area including at least the light-emitting diode is exposed in the outer peripheral unit made of a first resin; a sealing portion which is made of a second resin, the support member side of the hollow portion of the outer peripheral unit being filled with the second resin to seal the light-emitting diode; and a lens unit which is made of a third resin, the lens unit being laminated on the sealing portion by integral molding.

A method of producing a lens-equipped light-emitting diode device comprises: a process of mounting a light-emitting diode element on a support member; a first positioning process of positioning the support member in a first die; an outer peripheral unit forming process of supplying a resin into the first die to form an outer peripheral unit; a sealing process of sealing the light-emitting diode element; a second positioning process of positioning the support member in a second die; and a lens unit forming process of supplying a resin into the second die to form a lens unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and detailed description of the embodiments given below, serve to explain the principles of the invention.

DETAILED DESCRIPTION OF THE INVENTION

Figure 1:
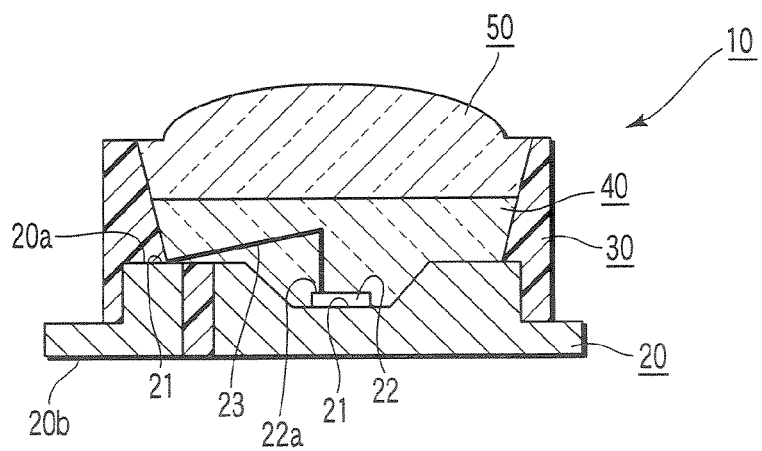
FIG. 1 is a longitudinal sectional view showing a lens-equipped light-emitting diode device according to a first embodiment of the invention.

FIG. 1 is a longitudinal sectional view showing a lens-equipped light-emitting diode device 10 according to a first embodiment of the invention. The lens-equipped light-emitting diode device 10 includes a lead frame 20, an outer peripheral unit 30, a sealing portion 40, and a lens unit 50. The lead frame 20 is a support member in which an electrode is formed. The outer peripheral unit 30 is formed on the lead frame 20. The sealing portion 40 is provided in the outer peripheral unit 30 and seals a light-emitting diode 22 and a bonding wire 23. The lens unit 50 is arranged in an upper portion of the sealing portion 40.

Plural electrodes 21 are formed on the side of a surface 20a of the lead frame 20, and a light-emitting diode 22 is mounted on the electrode 21. A bonding wire 23 is connected to one of the electrodes of the light-emitting diode 22, and the bonding wire 23 is connected to the electrode 21. In FIG. 1, the number 20b designates a backside of the lead frame 20.

A white color thermoplastic resin such as PPA, PC, and epoxy resin is used as a first resin forming the outer peripheral unit 30. A thermosetting resin or a UV curing resin, such as a transparent epoxy resin and transparent silicone, is used as a second resin forming the sealing portion 40. In the case of the device which emits white light, sometimes a fluorescent material for wavelength conversion is mixed to the resin. The thermosetting resin such as the transparent epoxy resin and the transparent silicone or the thermoplastic resin such as PMMA, PC, and COP is used as a third resin forming the lens unit 50.

Figure 2:
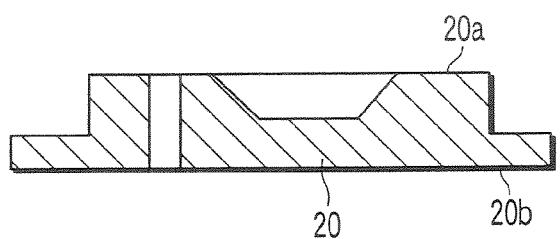
FIG. 2 is a longitudinal sectional view showing a process of producing the lens-equipped light-emitting diode device according to the first embodiment.
Figure 3:
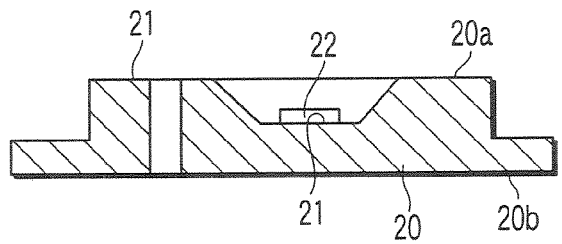
FIG. 3 is a longitudinal sectional view showing a process of producing the lens-equipped light-emitting diode device according to the first embodiment.
Figure 4:
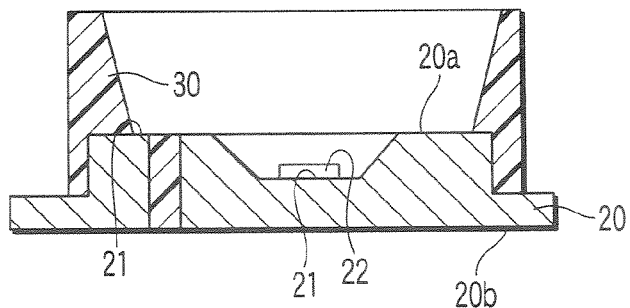
FIG. 4 is a longitudinal sectional view showing a process of producing the lens-equipped light-emitting diode device according to the first embodiment.

A method of producing the lens-equipped light-emitting diode device 10 will be described below. The lead frame 20 is prepared as shown in FIG. 2, and the light-emitting diode element is mounted on the lead frame with a die mounting material (not shown) as shown in FIG. 3. Then, these components are inserted in an injection molding die to form the outer peripheral unit 30 using a first white thermoplastic resin as shown in FIG. 4.

Figure 5:
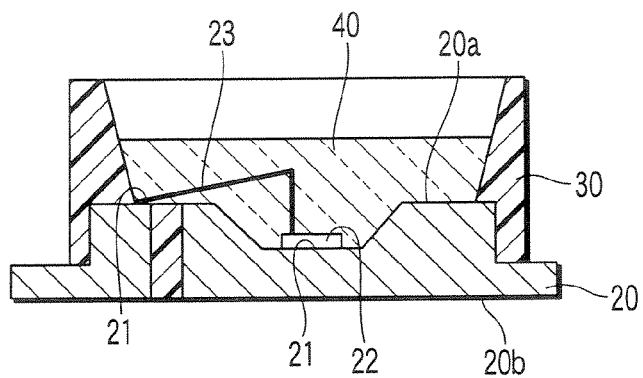
FIG. 5 is a longitudinal sectional view showing a process of producing the lens-equipped light-emitting diode device according to the first embodiment.

As shown in FIG. 5, wire bonding is performed between the electrode of the light-emitting diode element 22 and the electrode 21 of the lead frame 20, and the sealing portion 40 is formed around the light-emitting diode element 22 using a second sealing resin. At this point, the sealing portion 40 may be formed by the injection mold with the die or a potting method.

Figure 6:
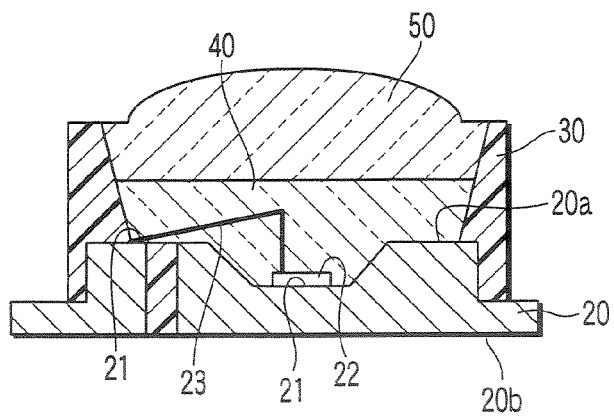
FIG. 6 is a longitudinal sectional view showing a process of producing the lens-equipped light-emitting diode device according to the first embodiment.

These molded components are inserted in the injection molding die different from those for molding the outer peripheral unit 30 and the sealing portion 40, and a lens unit 50 is integrally molded using a third transparent resin as shown in FIG. 6. A LIM method is adopted in the case where the thermosetting resin is used, and the injection molding method is adopted in the case where the thermoplastic resin is used.

In the lens-equipped light-emitting diode device 10 formed in the above-described manner, because the molding of the lens unit 50 and the attachment of the lens unit 50 to the outer peripheral unit 30 can simultaneously be performed, a process of attaching a resin lens produced by another process to the outer peripheral unit and a process of adjusting an optical axis are not required, which allows cost to be reduced in an assembly process.

A gap generated between the lens unit 50 and the outer peripheral unit 30 and a gap generated between the lens unit 50 and the sealing portion 40 can be prevented to improve the light extraction efficiency. Furthermore, attachment strength can be enhanced because the resins are fused at a boundary surface between the lens unit 50 and the sealing portion 40.

Thus, the lens-equipped light-emitting diode device of the first embodiment is excellent in the light extraction efficiency and the reliability, and the production cost can be reduced.

Figure 7:
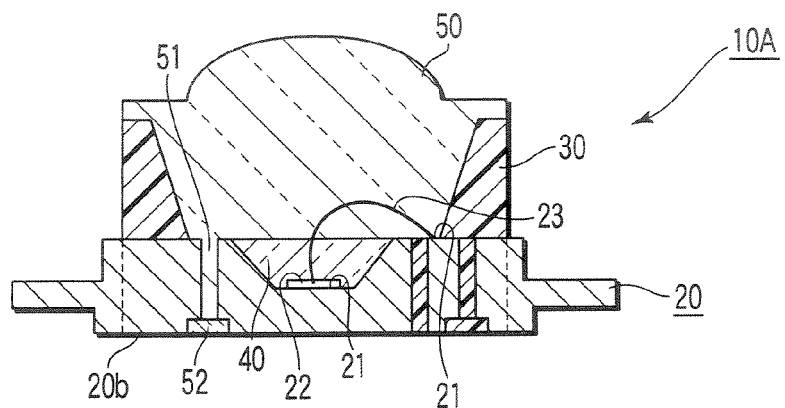
FIG. 7 is a longitudinal sectional view showing a lens-equipped light-emitting diode device according to a second embodiment of the invention.

FIG. 7 is a longitudinal sectional view showing a lens-equipped light-emitting diode device 10A according to a second embodiment of the invention. In FIG. 7, the same components as those of FIG. 1 are designated by the same numbers, and detailed description thereof will be omitted.

A penetration portion 51 is provided in the lens unit 50, and the penetration portion 51 is latched in the lead frame 20 at a front-edge portion 52 of the penetration portion 51. The penetration portion 51 penetrates the lead frame 20 to the backside 20b where the light-emitting diode 22 is not mounted.

In the lens-equipped light-emitting diode device 10A of the second embodiment, the same effect as the lens-equipped light-emitting diode device 10 can also be obtained. The lens-equipped light-emitting diode device 10A further has the following effect. In the case where the resins forming the outer peripheral unit 30 and the lens unit 50 are different from each other, it is difficult to secure adhesive strength between the outer peripheral unit 30 and the lens unit 50. Therefore, in the integral molding with the lens unit 50, the penetration portion 51 is formed to prevent drop-out of the lens unit 50 in such a manner that the penetration portion 51 is filled with a transparent resin to the backside 20b of the lead frame 20. This enables the adhesive strength to be enhanced to improve the reliability. The resin having a large shrinkage ratio and linear thermal expansion coefficient is used as the third resin forming the lens unit 51, which allows the effect to be increased. The thermoplastic resin or the thermosetting resin can be used as the third resin.

Figure 8:
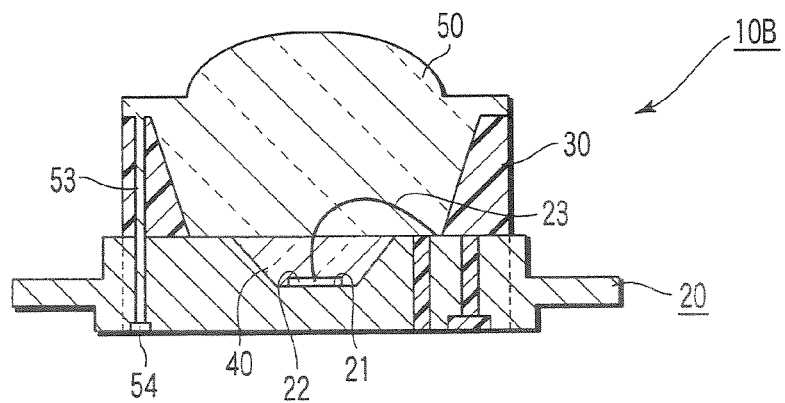
FIG. 8 is a longitudinal sectional view showing a lens-equipped light-emitting diode device according to a third embodiment of the invention.

FIG. 8 is a longitudinal sectional view showing a lens-equipped light-emitting diode device 10B according to a third embodiment of the invention. In FIG. 8, the same components as those of FIG. 1 are designated by the same numbers, and detailed description thereof will be omitted.

A penetration portion 53 is provided in the lens unit 50, and the penetration portion 53 is latched in the lead frame 20 at a front-edge portion 54 of the penetration portion 53. The penetration portion 53 penetrates the outer peripheral unit 30 and the lead frame 20 to the backside 20b where the light-emitting diode 22 is not mounted.

In the lens-equipped light-emitting diode device 10B of the third embodiment, the same effect as the lens-equipped light-emitting diode device 10A can also be obtained.

Figure 9:
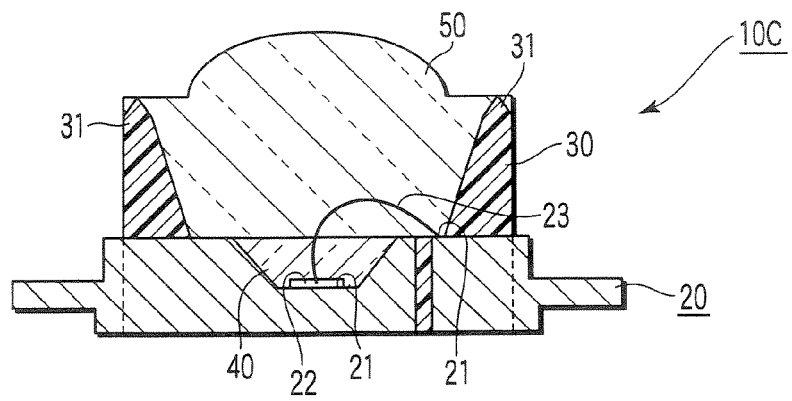
FIG. 9 is a longitudinal sectional view showing a lens-equipped light-emitting diode device according to a fourth embodiment of the invention.

FIG. 9 is a longitudinal sectional view showing a lens-equipped light-emitting diode device 10C according to a fourth embodiment of the invention. In FIG. 9, the same components as those of FIG. 1 are designated by the same numbers, and detailed description thereof will be omitted.

In the fourth embodiment, a micro-rib 31 is provided in an upper edge portion of the outer peripheral unit 30. In the lens-equipped light-emitting diode device 10C of the fourth embodiment, the same effect as the lens-equipped light-emitting diode device 10 can also be obtained, and only the micro-rib 31 is re-melted to weld the lens unit 50 by heat of the transparent resin when the lens unit 50 is molded. At this point, the welding strength can be enhanced by utilizing the resin having a higher melting point. In this case, the thermoplastic resin is used as the first resin and the third resin.

Figure 10:
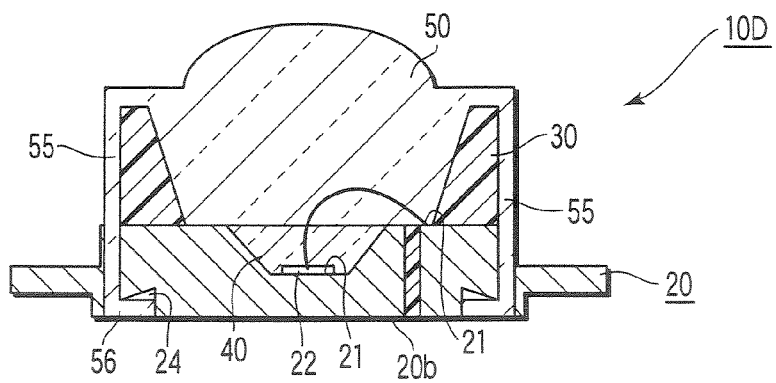
FIG. 10 is a longitudinal sectional view showing a lens-equipped light-emitting diode device according to a fifth embodiment of the invention.

FIG. 10 is a longitudinal sectional view showing a lens-equipped light-emitting diode device 10D according to a fifth embodiment of the invention. In FIG. 10, the same components as those of FIG. 1 are designated by the same numbers, and detailed description thereof will be omitted.

A notch portion 24 is provided in the lead frame 20. A latch portion 55 is provided in the lens unit 50, and a front-edge portion 56 of the latch portion 55 is engaged with the notch portion 24. The latch portion 55 penetrates the lead frame 20, and is extended to the backside 20b where the light-emitting diode 22 is not mounted.

In the lens-equipped light-emitting diode device 10D of the fifth embodiment, the same effect as the lens-equipped light-emitting diode device 10A can also be obtained.

Figure 11:
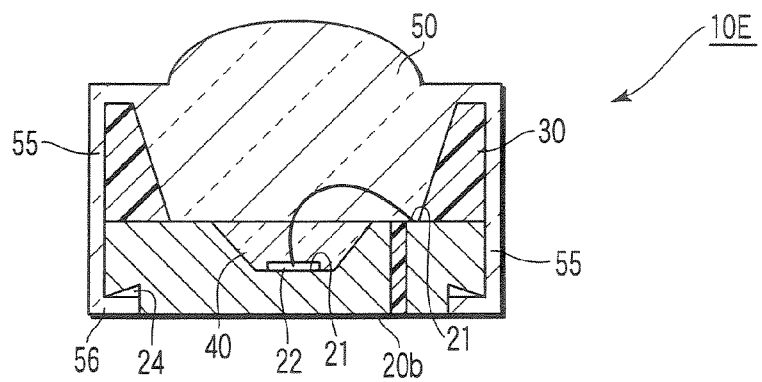
FIG. 11 is a longitudinal sectional view showing a lens-equipped light-emitting diode device according to a sixth embodiment of the invention.

FIG. 11 is a longitudinal sectional view showing a lens-equipped light-emitting diode device 10E according to a sixth embodiment of the invention. In FIG. 11, the same components as those of FIG. 1 are designated by the same numbers, and detailed description thereof will be omitted.

The lens-equipped light-emitting diode device 11E can be applied to the case where the latch portion 55 is provided in a side face different from that of the lens-equipped light-emitting diode device 10D. The notch portion 24 is provided in the lead frame 20. The latch portion 55 is also provided in the lens unit 50, and the front-edge portion 56 of the latch portion 55 is engaged with the notch portion 24. The latch portion 55 is extended along the side face of the lead frame 20, and the latch portion 55 is extended to the backside 20b where the light-emitting diode 22 is not mounted.

In the lens-equipped light-emitting diode device 10E of the sixth embodiment, the same effect as the lens-equipped light-emitting diode device 10D can also be obtained. In the lens-equipped light-emitting diode device 10E, it is not necessary that the latch portion 55 penetrate the lead frame 20.

Figure 12:
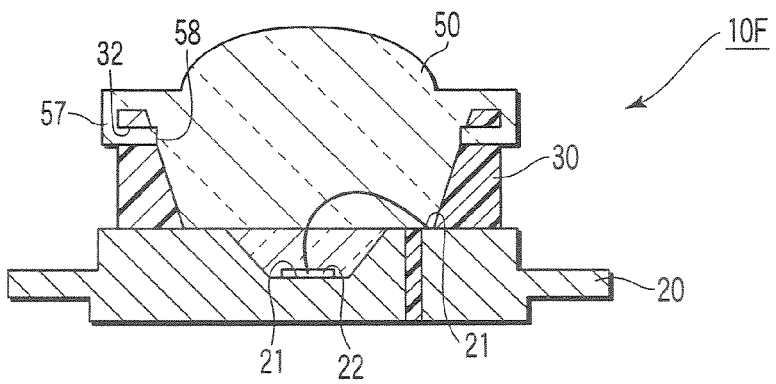
FIG. 12 is a longitudinal sectional view showing a lens-equipped light-emitting diode device according to a seventh embodiment of the invention.
Figure 13:
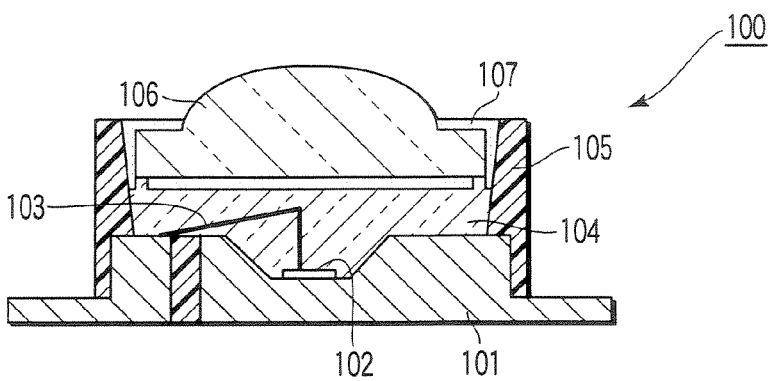
FIG. 13 is a longitudinal sectional view showing an example of a conventional lens-equipped light-emitting diode device.

FIG. 12 is a longitudinal sectional view showing a lens-equipped light-emitting diode device 10F according to a seventh embodiment of the invention. In FIG. 12, the same components as those of FIG. 1 are designated by the same numbers, and detailed description thereof will be omitted.

A through hole 32 is provided in the outer peripheral unit 30. A latch portion 57 is provided in the lens unit 50 while inserted into the through hole 32, and a front-edge portion 58 is engaged with the through hole 32. The notch portion may be provided in place of the through hole 32.

In the lens-equipped light-emitting diode device 10F of the seventh embodiment, the same effect as the lens-equipped light-emitting diode device 10A can also be obtained.

The structures and processes in the above embodiments are illustrated by way of example, and obviously the structures and processes may be replaced as appropriate. For example, the electrode of the light-emitting diode element 22 may be connected to the external electrode 21 not by the wire bonding but by the flip chip bonding. In the production process, the light-emitting diode element 22 may be mounted after the outer peripheral unit 30 is formed in the lead frame 20 using the white resin. The lens integral molding can also be injection-molded not on the lead frame 20 but on a support member in which the electrode is formed, e.g., a glass epoxy substrate and a ceramic substrate.

The invention is not limited to the above embodiments, but various modifications could be made without departing from the scope of the invention. Various inventions could also be made by the appropriate combination of the plural components disclosed in the embodiments. For example, some components shown in the embodiments can be eliminated from all the components. The components in the different embodiments may appropriately be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lens-equipped light-emitting diode device comprising:
    a support member in which an electrode is formed;
    a light-emitting diode which is mounted on the electrode of the support member;
    an outer peripheral unit which is provided on the support member, a hollow portion being formed while an area including at least the light-emitting diode is exposed in the outer peripheral unit made of a first resin;
    a sealing portion which is made of a second resin, the support member side of the hollow portion of the outer peripheral unit being filled with the second resin to seal the light-emitting diode; and
    a lens unit which is made of a third resin, the lens unit being laminated on the sealing portion by integral molding.

2. The lens-equipped light-emitting diode device according to claim 1, wherein the first resin is a white resin.

3. The lens-equipped light-emitting diode device according to claim 1, wherein the second resin is a transparent thermosetting resin, a transparent UV curing resin, or a material in which a fluorescent material for wavelength conversion is mixed with each of the transparent resins.

4. The lens-equipped light-emitting diode device according to claim 1, wherein the third resin is a transparent thermosetting resin or a transparent thermoplastic resin.

5. The lens-equipped light-emitting diode device according to claim 1, wherein the lens unit has an engagement portion which is engaged with the support member or the outer peripheral unit.

6. The lens-equipped light-emitting diode device according to claim 5, wherein the engagement portion has a penetration portion which is pierced to a backside from a surface on which the light-emitting diode element is mounted.

7. The lens-equipped light-emitting diode device according to claim 5, wherein the engagement portion has a penetration portion which is pierced from the outer peripheral unit to a backside of a surface of the support member on which the light-emitting diode element is mounted.

8. The lens-equipped light-emitting diode device according to claim 5, wherein the first resin and the third resin are a thermoplastic resin, and the engagement portion has a micro projection and a fusion portion, the micro projection being formed in an upper edge portion of the outer peripheral unit, the fusion portion being generated by melting the micro projection and the lens unit.

9. The lens-equipped light-emitting diode device according to claim 5, wherein the engagement portion has a latch member which is latched in a backside of a surface of the support member on which the light-emitting diode element is mounted.

10. A method of producing a lens-equipped light-emitting diode device comprising:

mounting a light-emitting diode element on a support member;

first positioning the support member in a first die;

supplying a resin into the first die to form an outer peripheral unit;

sealing the light-emitting diode element;

second positioning the support member in a second die; and supplying a resin into the second die to form a lens unit.

11. The method of producing a lens-equipped light-emitting diode device according to claim 10, wherein the resin supplied into the first die is a white resin.

12. The method of producing a lens-equipped light-emitting diode device according to claim 10, wherein a resin seals the light-emitting diode, and the resin is a transparent thermosetting resin, a transparent UV curing resin, or a material in which a fluorescent material for wavelength conversion is mixed with each of the transparent resins.

13. The method of producing a lens-equipped light-emitting diode device according to claim 10, wherein the resin supplied into the second die is a transparent thermosetting resin or a transparent thermoplastic resin.

14. The method of producing a lens-equipped light-emitting diode device according to claim 10, wherein the lens unit is an engagement portion which is engaged with the support member or the outer peripheral unit.

15. The method of producing a lens-equipped light-emitting diode device according to claim 14, wherein the engagement portion has a penetration portion which is pierced to a backside from a surface on which the light-emitting diode element is mounted.

16. The method of producing a lens-equipped light-emitting diode device according to claim 14, wherein the engagement portion has a penetration portion which is pierced from the outer peripheral unit to a backside of a surface of the support member on which the light-emitting diode element is mounted.

17. The method of producing a lens-equipped light-emitting diode device according to claim 14, wherein the first resin and the third resin are a thermoplastic resin, and the engagement portion has a micro projection and a fusion portion, the micro projection being formed in an upper edge portion of the outer peripheral unit, the fusion portion being generated by melting the micro projection and the lens unit.

18. The method of producing a lens-equipped light-emitting diode device according to claim 14, wherein the engagement portion has a latch member which is latched in a backside of a surface of the support member on which the light-emitting diode element is mounted.

* * * * *